United States Patent [19]

Levinson et al.

[11] Patent Number: 5,294,927
[45] Date of Patent: Mar. 15, 1994

[54] MULTI-CHANNEL DIGITAL TO ANALOG CONVERTER

[75] Inventors: Roger A. Levinson, San Francisco; John M. Caruso, Fremont; Ali Tasdighi, San Jose, all of Calif.

[73] Assignee: Micro Power Systems, Inc., San Jose, Calif.

[21] Appl. No.: 868,070

[22] Filed: Apr. 13, 1992

[51] Int. Cl.$^5$ .............................................. H03M 1/68
[52] U.S. Cl. .................................... 341/141; 341/145; 341/154
[58] Field of Search ............... 341/141, 144, 145, 148, 341/154

[56] References Cited

U.S. PATENT DOCUMENTS

| | | | |
|---|---|---|---|
| 4,146,882 | 3/1979 | Hoff, Jr. et al. | 341/148 |
| 4,198,622 | 4/1980 | Connolly, Jr. et al. | 341/145 |
| 4,494,107 | 1/1985 | Kearns et al. | 341/145 |
| 4,973,979 | 11/1990 | Ikeda | 341/145 |

Primary Examiner—Howard L. Williams
Attorney, Agent, or Firm—Townsend and Townsend Khourie and Crew

[57] ABSTRACT

A digital to analog converter employs an operational amplifier as an active summing device for summing a first analog voltage corresponding to most significant bits of a digital value and a second analog voltage corresponding to least significant bits of the digital value. In a multi-channel application, a single MSB DAC can be shared by all channels through first MUXs in each channel with each channel having an independent LSB DAC. Alternatively, a single LSB DAC can be shared by all channels through second MUXs in each channel. Gain of the voltage summing operational amplifier in each channel is determined by values of a resistor connecting the output of the LSB DAC to the inverting negative input of the operational amplifier and of a feedback resistor connecting the amplifier output to the inverting negative input.

4 Claims, 4 Drawing Sheets

MULTI-CHANNEL DIGITAL TO ANALOG CONVERTER

BACKGROUND OF THE INVENTION

This invention relates generally to digital-to-analog converters (DAC), and more particularly the invention relates to multi-channel DACs.

Most DAC implementations use a single network to translate all of the digital data bits to analog levels. However, the feasibility of such an approach becomes limited as the number of bits, and therefore the network size and accuracy, increase. Furthermore, the feasibility of implementing multiple DACs which match each other is even further reduced since all of the channels use completely independent networks. One solution shown in prior art uses a single DAC whose output feeds multiple sample and hold amplifiers. This implementation gives excellent matching between channels but requires a systematic updating of each channel which causes glitches in the DAC outputs, as well as calibration wait cycle problems and slow digital update rate characteristics. Furthermore, only one DAC channel can be updated at a particular time.

The accuracy of a DAC is dominated by the network which maps the most significant bits (MSB) of the digital value to an analog value. It is known that a DAC can be split into two or more independent parts, one accurate network for the MSBs and one or more less accurate networks for LSBs. The outputs of these separate networks are then summed together. Where all of the networks output a current, the outputs can be tied together to produce a sum. Where all of the networks output a voltage, the outputs can be summed together with resistors. Prior art also shows that an output voltage can be created using an operational amplifier with resistive feedback by applying voltage to the positive terminal of the amplifier and a high output impedance current source to the negative terminal of the operational amplifier. See U.S. Pat. No. 4,811,017.

SUMMARY OF THE INVENTION

The present invention is directed to a multi-channel DAC signal converter using voltage summing operational amplifiers. A single channel DAC in accordance with the invention includes a first, accurate network controlled by the MSBs of a digital value for providing a corresponding first analog voltage value and a second, less accurate network controlled by the LSBs of the digital value for providing a corresponding second analog voltage. An operational amplifier functions as an active voltage summer for producing a single analog output.

The first voltage value representing the MSB value is applied to the positive or non-inverting input of the operational amplifier, and the second voltage value representing the LSB value is applied through a first resistor to the negative or inverting input to the operational amplifier. A second resistor is connected between the output of the operational amplifier and the inverting input whereby the operational amplifier sums the two input voltages. Gain of the operational amplifier as required for specific channels in a multi-channel application, is set by the values of the first and second resistors.

In a multi-channel implementation, the first, accurate MSB network is shared with independent LSB networks in each channel. An analog MUX in each channel connects the MSB network to the active summing device in each channel. Alternatively, a single LSB network along with a single MSB network can be shared by all channels with each channel having its own active summing device with sample and hold circuitry.

The invention and objects and features thereof will be more readily apparent from the following detailed description and appended claims when taken with the drawings.

DETAILED DESCRIPTION OF THE ILLUSTRATIVE EMBODIMENTS

Figure 1:
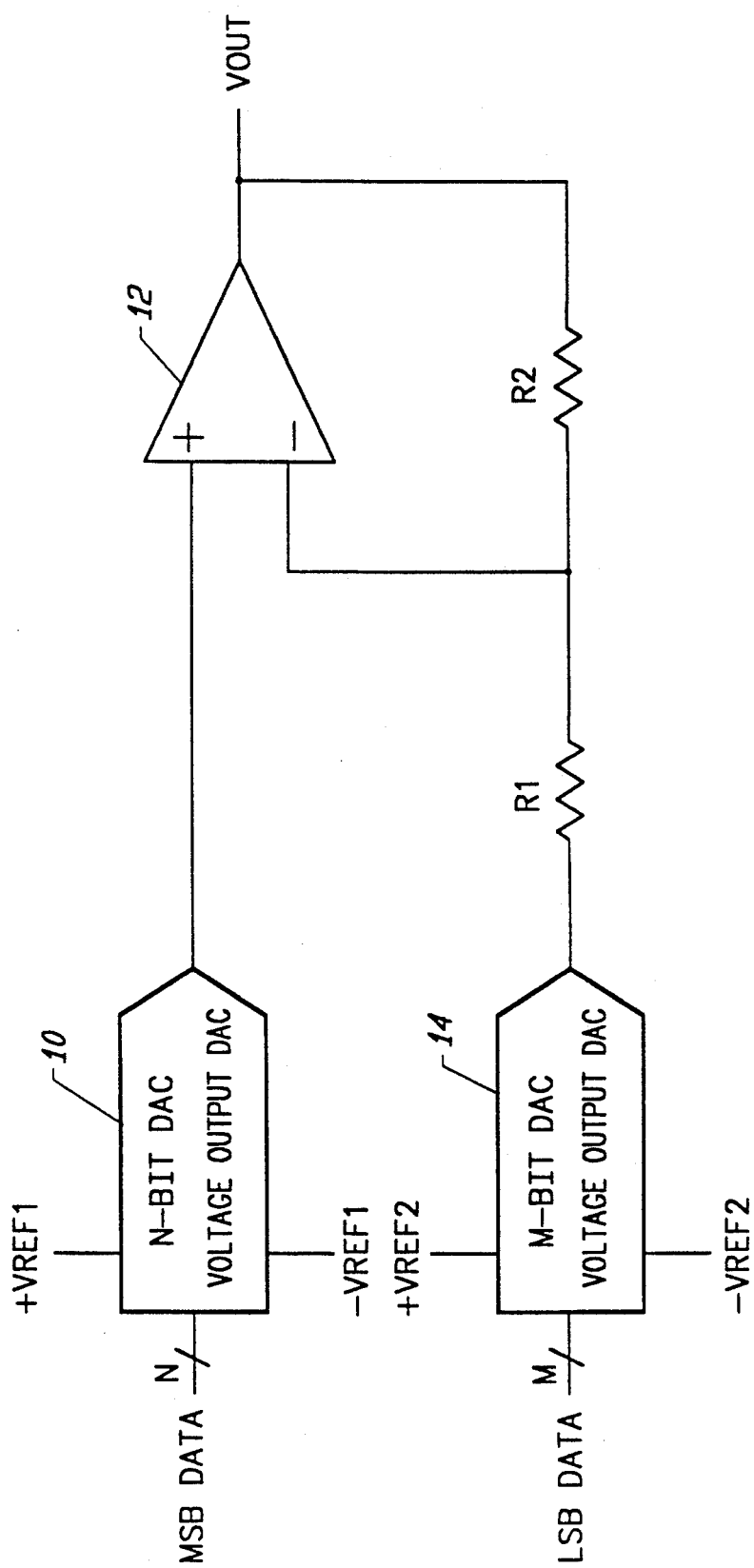
FIG. 1 is a functional block diagram of a DAC employing an active voltage summing device in accordance with the invention.

Referring now to the drawings, FIG. 1 is a functional block diagram of a DAC employing an active voltage summing device in accordance with the invention for converting an (N+M) bit digital value which is split into N MSBs and M LSBs. A first resistive network 10 receives N most significant bits (MSB) of a digital value and produces a first analog voltage in response thereto which is connected to the positive non-inverting input of operational amplifier 12. A second resistive network 14 receives M least significant bits of the digital value and produces a second analog voltage in response thereto which is connected through resistor R1 to the negative inverting input of operational amplifier 12. The output of operational amplifier 12 is connected through resistor R2 to the negative inverting input. The resistors R1 and R2 combined with the operational amplifier sum the MSB and the LSB DAC output voltages and provide an analog output for the (N+M) bit digital input. The gain of the amplifier 12 from the positive input to the output is determined by the resistor values R1,R2 in accordance with the following equation:

$$1 + \frac{R_2}{R_1}$$

The most significant bit resistive network 10 is connected between a plus reference voltage (VREF1P) and a negative reference voltage (VREF1N) with the resistive network being an accurate DAC network such as a thermometer resistor divider or an R-2R resistor network, both known in the art.

The M bit LSB resistive network 14 can be a similar resistive network but need not have the accuracy of network 10. Network 14 is connected between a positive voltage reference (VREF2P) and a negative voltage reference (VREF2N) and responds to the M least significant bits of a digital value. The gain of the LSB path is set by resistors R1 and R2 in accordance with the following equation:

$$-\frac{R2}{R1}$$

Figure 2:
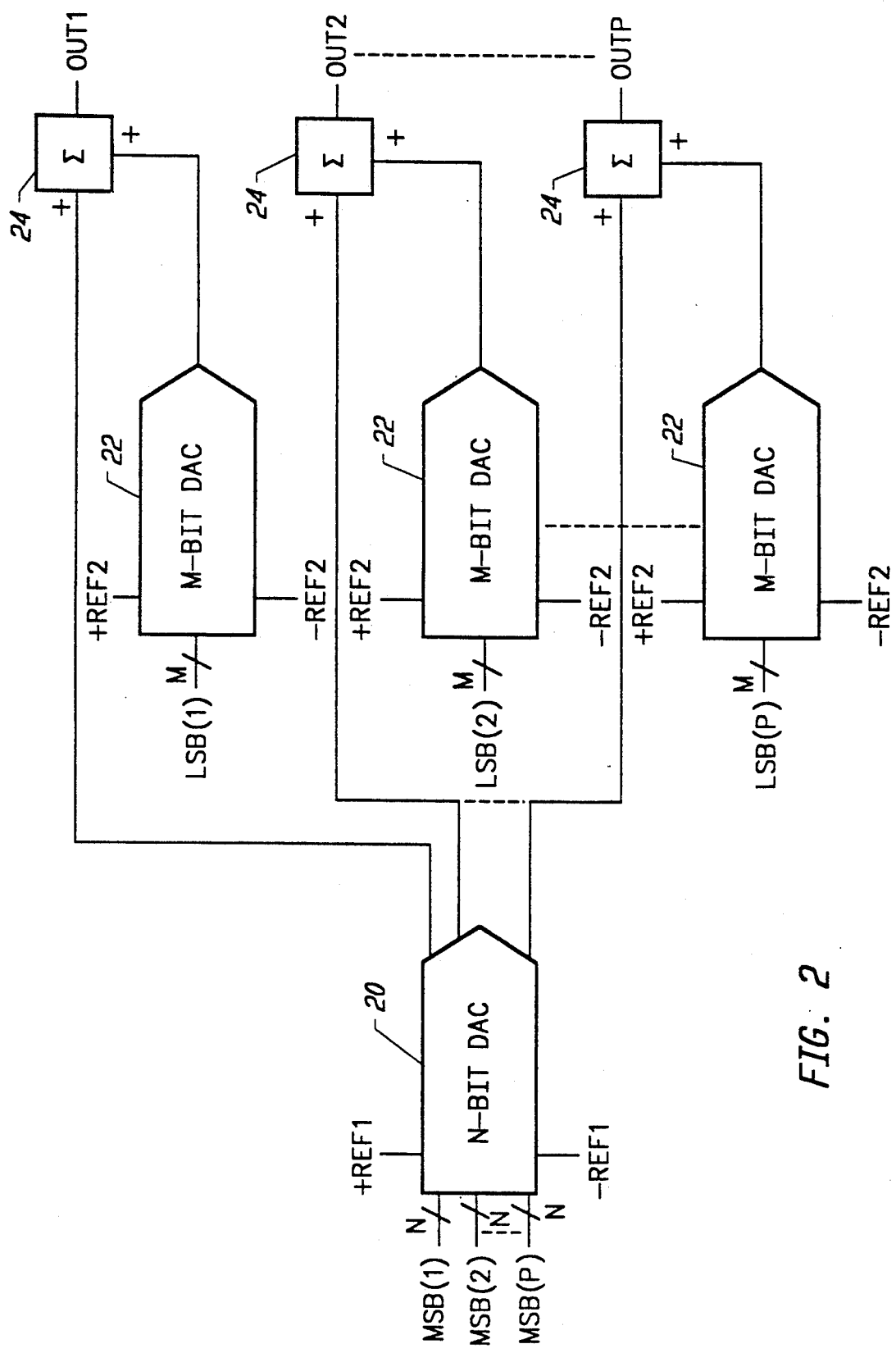
FIG. 2 is a functional block diagram of a multi-channel DAC in accordance with the invention.

FIG. 2 is a functional block diagram of a multi-channel DAC in accordance with the invention. In this embodiment the most significant bit DAC 20 is shared by a plurality of channels (1-P) with each channel having its own least significant bit DAC 22 and summing operational amplifier shown generally at 24. Thus each channel shares the accurate most significant bit DAC 20 while the least significant bits for digital values in each channel are applied to independent DACs 22.

Figure 3:
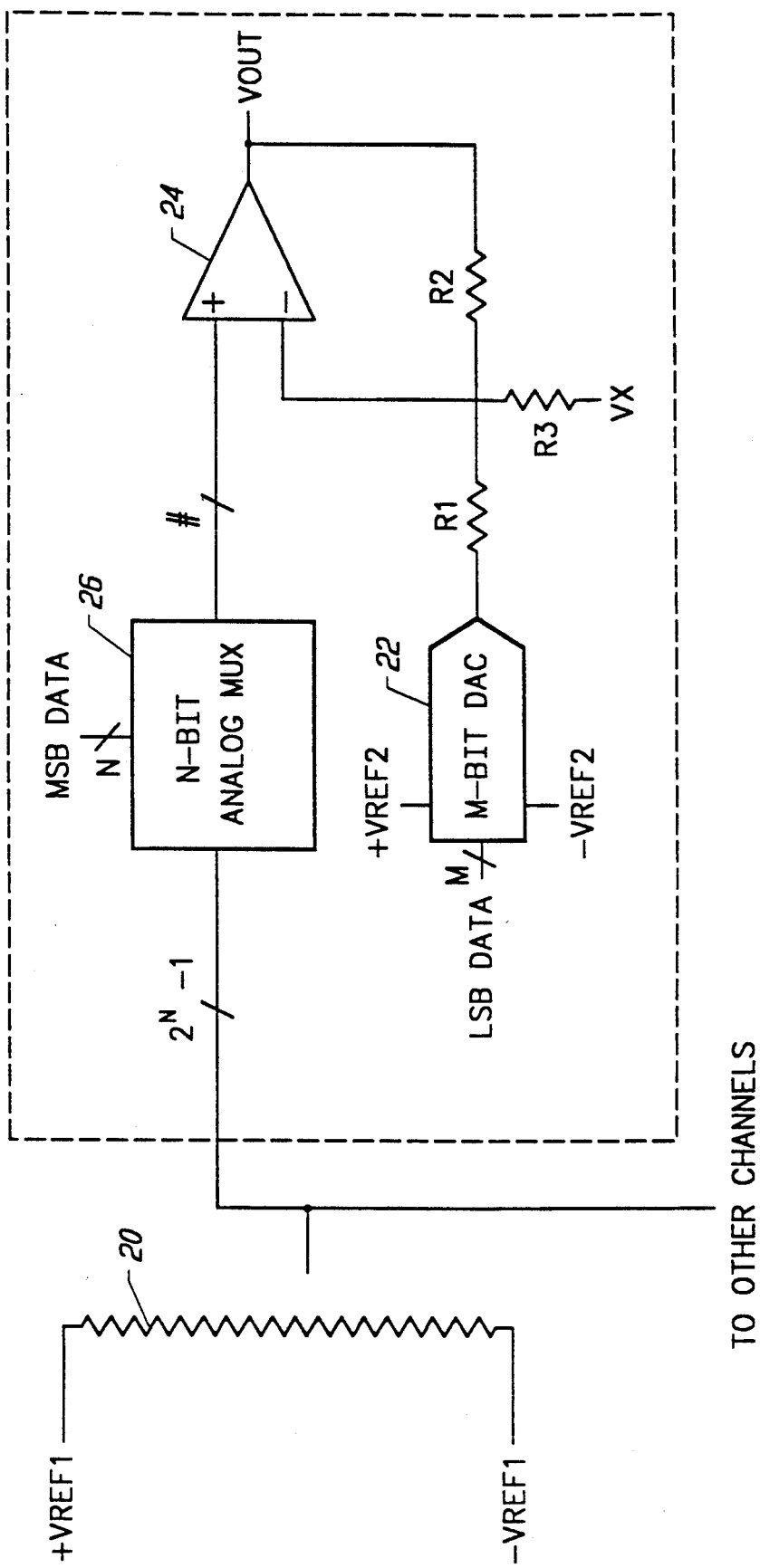
FIG. 3 is a functional block diagram of one channel of a multi-channel DAC in accordance with the preferred embodiment of the invention.

FIG. 3 is a functional block diagram of one channel of a multi-channel DAC in accordance with a preferred embodiment of the invention. The resistive network 20 for the MSB DAC includes a number of taps corresponding to the various digital codes of the most significant bits. For example, a 4 bit code has 15 voltage taps corresponding to the various combinations of the 4 bits. All of the taps are connected to each channel through an N bit analog MUX 26 in the channel which responds to the most significant bit data for the digital value applied to that channel. Thus all channels can access the MSB resistive network 20 simultaneously. It will be noted that an optional resistor R3 can be connected between ground and the common terminal of resistors R1,R2. R3 allows the LSB DAC to use the same reference voltages, VREF1, VREF2 as the MSB DAC.

Figure 4:
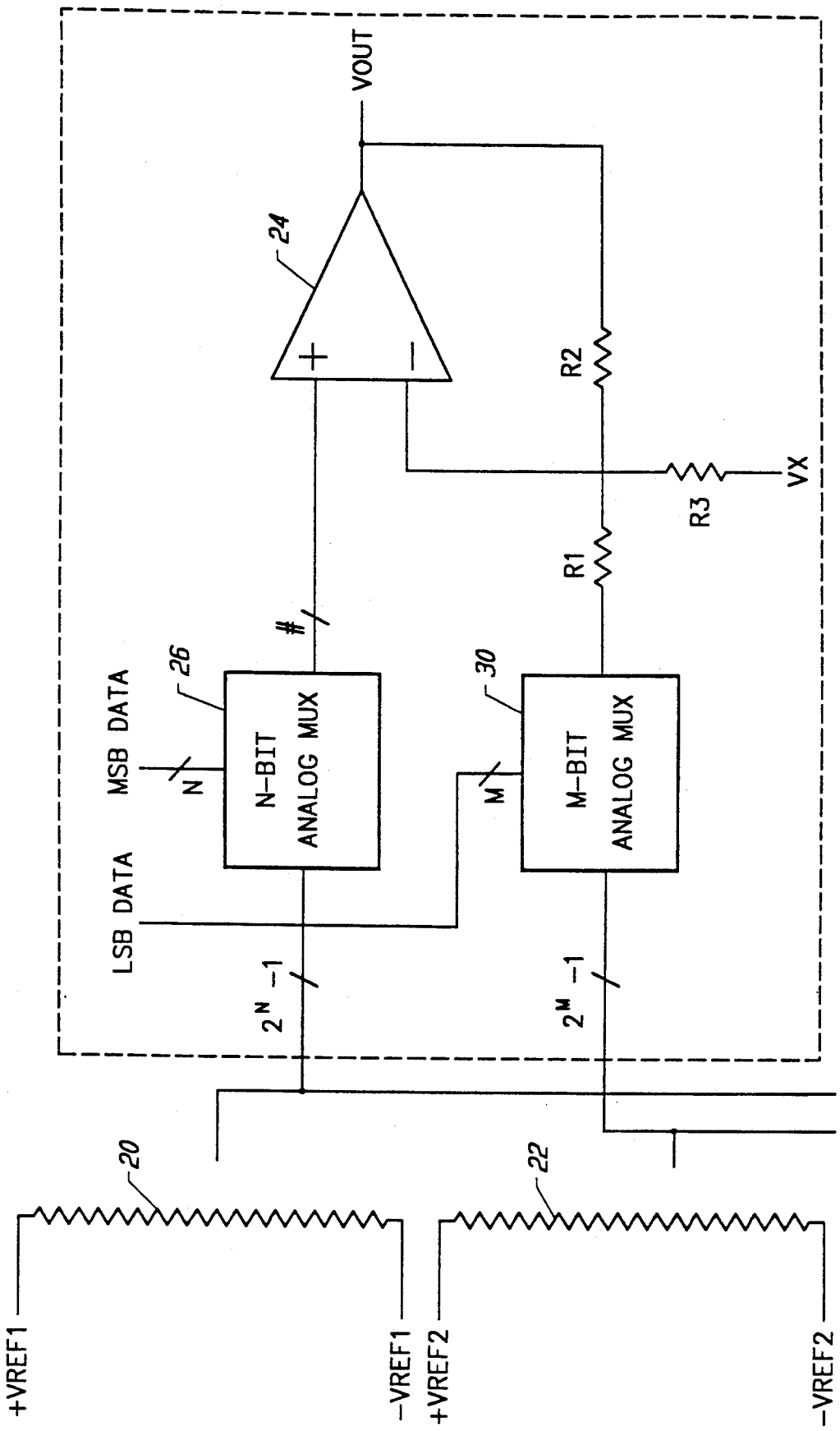
FIG. 4 is a functional block diagram of a multi-channel DAC in accordance with an alternative embodiment of the invention.

FIG. 4 is a functional block diagram of yet another embodiment of the invention in which multiple channels share a most significant bit DAC 20 and a least significant bit DAC 22. Each channel is connected to the most significant bit DAC 20 through an N bit analog MUX 26 as in FIG. 3 and to the LSB DAC 22 through an M bit analog MUX 30. Thus two DACs are shared by all channels which have simultaneous access to the two DACs. Again, the output of the LSB analog MUX 30 can be connected through the resistive network comprising resistors R1, R2, R3 to establish gain of the amplifier 24 and for utilizing one common pair of reference voltages in the two MUXs.

There has been described several embodiments of a multi-channel digital-to-analog signal converter employing one shared independently controlled MSB network and one or more LSB networks. By sharing the MSB network which dominates the accuracy characteristics of the DAC, all of the channels will have the benefit of high accuracy and excellent matching. If trimming or calibration is required to achieve the required accuracy, only the single MSB network needs adjusting which significantly reduces trim time or calibration complexity.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A multi-channel digital-to-analog converter (DAC) comprising:
    a first network producing $2^N$ precision first analog voltages for N most significant bits (MSB) of a digital value,
    a plurality of second networks, independent from said first network, each receiving least significant bits (LSB) and providing a second analog voltage in response thereto,
    a plurality of operational amplifiers each having a positive non-inverting input terminal, a negative inverting input terminal, and an output terminal,
    means including a plurality of N bit MUXs receiving N most significant bits of a digital value and connecting one voltage of said first network to said positive non-inverting input terminal of said plurality of operational amplifiers,
    means including first resistors connecting said second analog voltages to said negative inverting input terminals, and
    means including second resistors connecting said output terminals to said negative inverting input 2. The multi-channel digital-to-analog converter (DAC) as defined by claim 1 wherein each operational amplifier has a gain determined by a first resistors and a second resistor.

3. The multi-channel digital-to-analog converter as defined by claim 2 wherein said first network and said second networks comprise resistor divider networks.

4. The multi-channel digital-to-analog converter as defined by claim 3 wherein said first network comprises a four bit thermometer resistor divider and said second network comprises R-2R resistor networks in a voltage mode configuration having constant output resistance over all digital input codes.

* * * * *